United States Patent [19]

Mattern

[11] 3,781,871

[45] Dec. 25, 1973

[54] ANALOG TO DIGITAL CONVERTER

[75] Inventor: John Mattern, Baltimore, Md.

[73] Assignee: Westinghouse Electric Corporation, Pittsburgh, Pa.

[22] Filed: June 13, 1972

[21] Appl. No.: 262,436

[52] U.S. Cl. .......... 340/347 AD
[51] Int. Cl. .......... H03k 13/02
[58] Field of Search .......... 340/347 AD, 347 NT, 340/347 CC

[56] References Cited

UNITED STATES PATENTS

| | | | |
|---|---|---|---|
| 3,521,269 | 7/1970 | Brooks | 340/347 AD |
| 3,201,781 | 8/1965 | Holland | 340/347 AD |
| 3,706,092 | 12/1972 | Cox, Jr. | 340/347 AD |
| 3,313,924 | 4/1967 | Schultz | 340/347 NT |
| 3,696,400 | 10/1972 | Lang | 340/347 AD |

*Primary Examiner*—Daryl W. Cook
*Assistant Examiner*—Jeremiah Glassman
*Attorney*—F. H. Henson et al.

[57] ABSTRACT

A successive approximation analog to digital converter having a variable rate clock for increasing the conversion speed. The frequency of the clock is varied to accommodate the actual settling time required for each digital output bit, such that the frequency of the clock is made to speed up as the converter operates to first generate the most significant bit and then successively generate intermediate bits up to the least significant bit.

10 Claims, 3 Drawing Figures

PATENTED DEC 25 1973 3,781,871

ANALOG TO DIGITAL CONVERTER

BACKGROUND OF THE INVENTION

1. Field of the Invention

This invention relates generally to data form converters and more particularly to analog to digital converters employing the technique of successive approximation.

2. Description of the Prior Art

In known prior art apparatus utilizing the process of successive approximation for converting analog data to digital form, the output of a digital to analog converter is compared with the unknown analog voltage. A sequence of N comparisons where N is equal to the number of converter bits, is effected to find the digital equivalent of the analog voltage. The sequencing of the comparisons and the storage of the results takes place in a logic circuit. The timing, however, for such a prior art converter is commonly supplied by a constant frequency clock wherein the timing frequency is determined and set by the "worst case" settling time requirement of the D/A converter, i.e., the most significant bit. This fixed frequency provides a fundamental limitation on the dynamic range for a given system bandwidth, even though the least significant bit will settle to an acceptable accuracy in a fraction of the worst case settling time.

SUMMARY

Briefly, the subject invention is directed to a successive approximation analog to digital converter having a controlled variable rate clock. The clock is comprised of an externally controlled oscillator including a NAND digital logic circuit which is enabled by a master flip-flop. The NAND circuit is coupled to a fixed time delay circuit and a positive feedback loop having an externally controlled time delay means which exhibits a double logic inversion. The delayed output of the NAND circuit resulting from the enabling input is fed back to the other input of the NAND circuit whereupon the other half of the waveform is produced. The regenerative process thereupon continues until the aforementioned master flip-flop is reset by a strobe timing circuit. Clock output pulses are fed to the strobe circuit and a logic circuit. The strobe circuit controls the logic circuit which stores a digital word which is generated by successive approximations. The analog output of the D/A converter is fed to a comparator which also receives as an input the unknown analog input signal. The difference signal output of the converter is fed back to the logic circuitry which generates a predetermined digital word accordingly. The strobe circuit, however, is operable to generate one or more time delay control signals in accordance with the clock count which is coupled back to the time delay means of the oscillator for increasing the frequency of the clock output so that the variable rate clock starts off slowly and then speeds up as the conversion process continues.

DESCRIPTION OF THE PREFERRED EMBODIMENT

Figure 1:
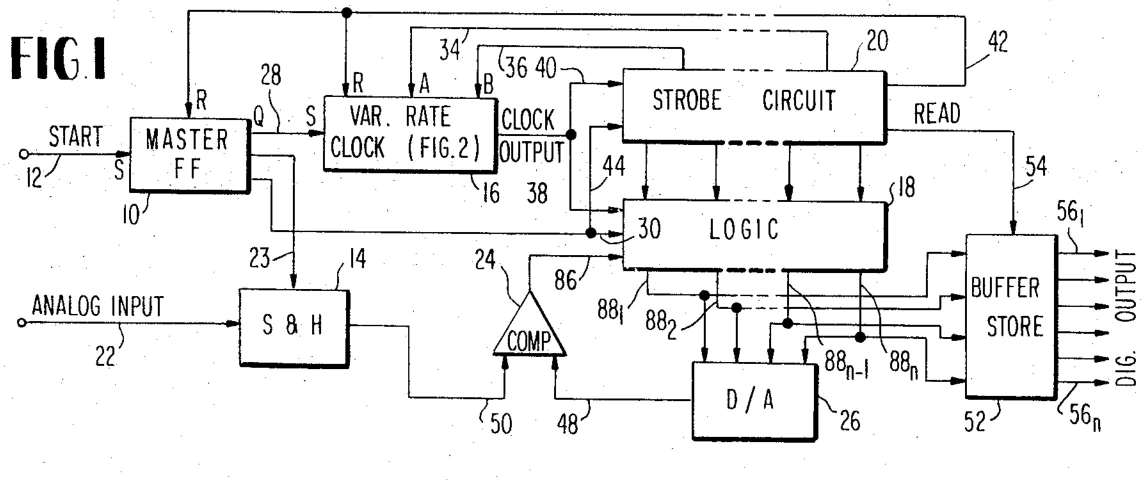
FIG. 1 is a block diagram illustrative of the preferred embodiment of the subject invention.

Referring now to the drawings wherein like reference numerals refer to like parts throughout, attention is first directed to FIG. 1 wherein the block diagram disclosed includes, inter alia, a master flip-flop circuit 10 which has a start or interrogation signal applied thereto from signal lead 12. The master flip-flop 12 generates respective control output signals which are fed to a sample and hold switch 14 to which is applied an analog input signal, an externally controlled variable frequency clock 16, a digital logic circuit 18 and a strobe circuit 20. The sample and hold circuit 14 receives the analog input signal over circuit lead 22 and receives an enable signal from the master flip-flop 10 over circuit lead 23. The purpose of the sample and hold switch 14 is to sample the amplitude of the analog input signal and hold it for a predetermined period determined by the master flip-flop circuit 10. This stored magnitude of the analog input signal is applied to an analog comparator circuit 24 along with the analog output of a parallel conversion digital to analog (D/A) converter 26. The variable rate clock 16 receives an enable control signal from the master flip-flop 10 by means of circuit lead 28. The digital logic circuit 18 and strobe timing circuit 20 are coupled to the master flip-flop circuit 10 by means of circuit lead 30 for receiving a reset control signal therefrom.

The variable rate clock 16 provides a series of pulses referred to as clock pulses which are applied as inputs to the logic circuit 18 and the strobe circuit 20. The strobe circuit 20 is actually comprised of a shift register and has for its function applying timing strobe signals to the logic circuit 18 in response to a predetermined count of the clock pulses as well as coupling a first and second binary control signal A and B over circuit leads 34 and 36 for changing the frequency of the variable rate clock 16 in response to the count of the clock pulses. The clock pulses are applied to the logic circuit 18 and the timing circuit 20 by means of circuit leads 38 and 40, respectively. The strobe circuit 20, moreover, feeds a reset signal back to the master flip-flop circuit 10 and the clock 16 by means of circuit lead 42 when a predetermined count has been reached at the end of a conversion period. The master flip-flop 10, couples a reset signal to the strobe circuit 20 by means of circuit lead 44 at the end of operation for resetting the first bit of the shift register 20 to "1."

A parallel conversion digital to analog converter 46 is coupled to the logic circuit 18 and provides an analog output signal on circuit lead 48 which is applied to the analog comparator circuit 24 along with the sampled analog input signal coupled thereto from the sample and hold switch 14 by means of circuit lead 50. The logic circuit 18 also is coupled to a buffer storage 52 which also receives a timed control signal from the strobe circuit 20 over circuit lead 54 for initiating a readout of the digital value of the sampled input signal on circuit leads $56_1 \ldots 56_n$ at the end of the conversion period.

Figures 2, 3:
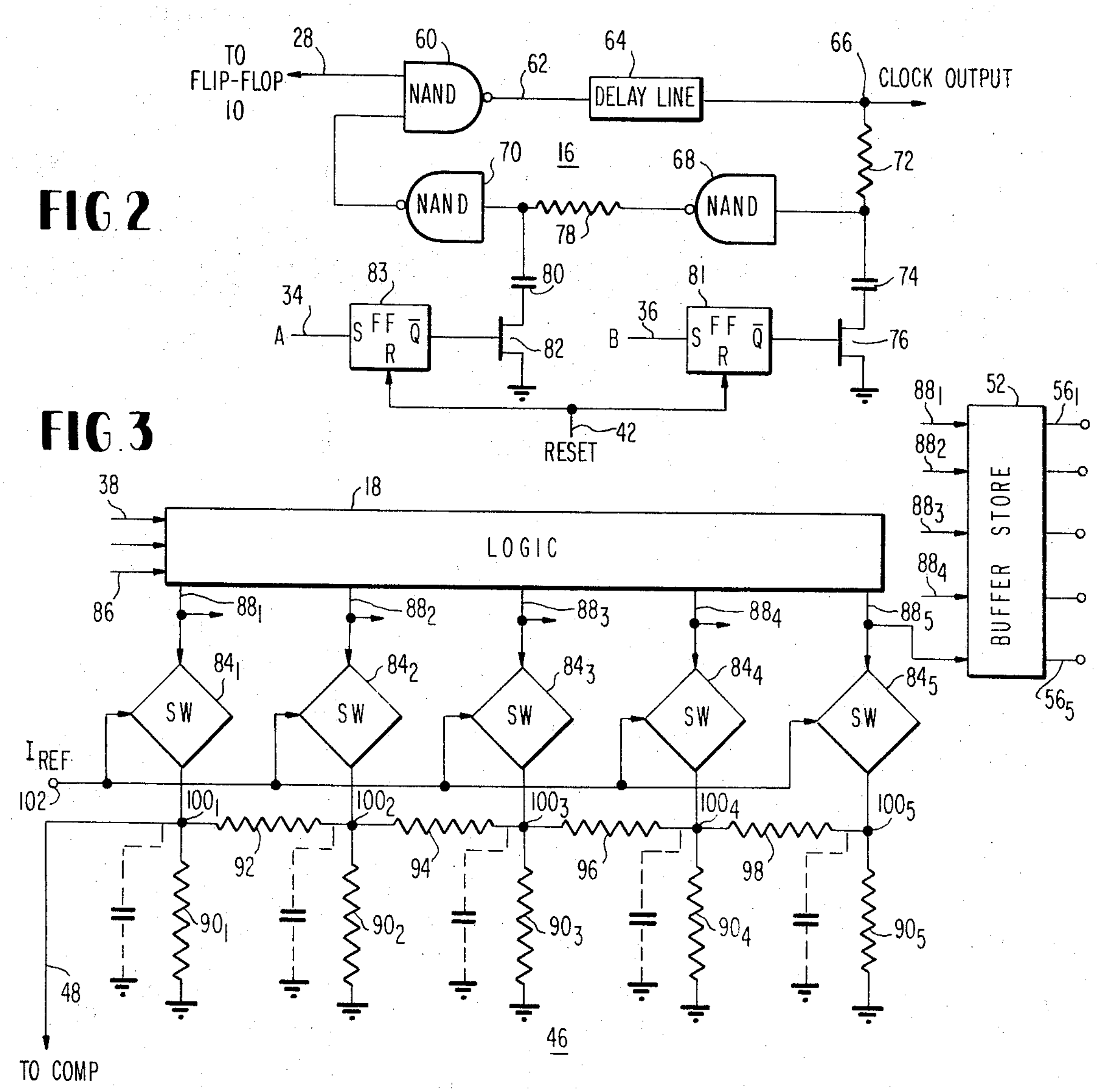
FIG. 2 is an electrical circuit diagram illustrative of the variable rate clock incorporated in the embodiment shown in FIG. 1.
FIG. 3 is an electrical schematic diagram partially illustrative of the successive approximation digital to analog converter circuitry incorporated in the embodiment shown in FIG. 1.

Prior to discussing the operation of the apparatus disclosed in FIG. 1, reference is now briefly made to FIG. 2 wherein an electrical schematic diagram is disclosed of the variable rate clock 16 shown in FIG. 1. The Q output of master flip-flop 10 appearing on circuit lead 28 comprises an "enable" signal and is coupled to the NAND circuit 60. The digital output of the NAND circuit 60 is coupled to a fixed delay line 64 whose output connects to circuit junction 66. Next a positive feedback loop having a variable time delay is connected to the other input of the NAND circuit 60. This feedback loop includes two logic inverters comprised of single input NAND circuits 68 and 70, as well as two gated RC time delay circuits comprised of resistor 72, capacitor 74, FET switch 76 and resistor 78, capacitor 80 and FET switch 82, respectively. The FET switches 76 and 82 are respectively coupled to the Q outputs of flip-flops 81 and 83 having their set (S) inputs coupled to circuit leads 36 and 34.

The circuit configuration shown in FIG. 2 operates as a clock oscillator having a controlled clock output frequency determined by the conductive states of the FET switches 76 and 82, which in turn are respectively controlled by the flip-flops 81 and 82 which are set by signals A and B respectively from the strobe circuit 20. The operation of the variable rate clock oscillator is initiated by an "enable" pulse which is applied thereto from the master flip-flop circuit 10. At this time, the Q output of flip-flop 10 goes positive (high). Since this is applied to the one input of the NAND circuit 60, the output of the NAND circuit appearing on circuit lead 64 goes negative (low). The negative going leading edge propagates through the delay line 62 and around the feed-back loop, being twice inverted by the inverting amplifier NAND circuits 68 and 70, and is applied as a negative input to the other input of the NAND circuit 60 which in turn produces a positive output. The positive going leading edge is then propagated around the loop. Thus a regenerative square wave oscillator is provided. The RC time constants of the combination of resistor 72 plus capacitor 74 and resistor 78 plus capacitor 80, provide additional time delays for the feedback of the output of the NAND circuit 60 back to its other input.

The FET switches 76 and 82 are rendered normally conductive by means of the binary $\overline{Q}$ outputs from the flip-flops 81 and 83 when they are reset by the strobe circuit 20 at the end of a preceding conversion period. This reset signal is applied over circuit lead 42. The conductive FET switches thus act as closed switches coupling the respective capacitors 74 and 80 to ground. This condition causes a maximum time delay of the travel of the leading edge of the pulse at the output of the NAND circuit 60 around the feedback loop. Accordingly, the frequency of the oscillator at this time is at a first relatively low value.

The strobe circuit 20 shown in FIG. 1, however, counts the clock pulse output appearing at circuit junction 66 and after a predetermined number of cycles, couples a binary signal A via circuit lead 34 to flip-flop 83 which switches to its other binary state causing FET switch 82 to become nonconductive, and thereby removing capacitor 80 from ground. This action causes the frequency of oscillation to increase. At a second predetermined later time, the strobe circuit 20 couples a second binary control signal B via circuit lead 36 to flip-flop 81 causing it to switch states. The $\overline{Q}$ output coupled to FET switch 76 biases the switch off so that an open circuit is provided between capacitor 74 and ground. This deactivates the second RC delay, causing the frequency of the oscillator to increase still more. Thus, it can be seen that the clock oscillator shown in FIG. 2 is initially started by the master flip-flop 10 and starts off at a relatively slow rate but then increases in frequency as the strobe circuit 20 counts the clock pulse output and operates the logic circuit 18. The number of frequency changes or transitions is a matter of choice and can be made as smooth as desired simply by increasing the number of frequency step changes.

The purpose of the variable rate clock oscillator shown in FIG. 2, is to accommodate the required settling time for the respective digital output bits of the digital to analog converter circuitry employed, an example of which is shown in FIG. 3. By way of further background, in the widely known and used technique of successive approximation analog to digital conversion, the value of the analog signal at a given time is rapidly compared with certain digital values until the closest match is found and this closest digital value is fed out of the analog to digital converter. This comparison procedure is repeated at desired time intervals determined by the strobe circuit to provide a succession of digital values closely representative of the varying analog signal. The comparison procedure is usually performed in a logical manner so as to arrive at the nearest digital value in the shortest possible time. Such apparatus is shown in FIG. 3.

The circuit shown in FIG. 3 is representative of a five bit converter including switches $84_1$, $84_2$, $84_3$, $84_4$ and $84_5$. The digital logic circuit 18 receives an input from the comparator circuit 24 shown in FIG. 1 via circuit lead 86 and accordingly provides a predetermined five bit digital output word on lines $88_1$, $88_2$ . . . $88_5$, which are respectively coupled to the switches $84_1$, $84_2$, . . . $84_5$ and the buffer storage 52. Depending upon the binary value of each of the five bits, the switches $84_1$ . . . $84_5$ will be open or closed accordingly. Each of the switches $84_1$, $84_2$, $84_3$, $84_4$ and $84_5$, are coupled to a ladder network comprised of grounded resistors $90_1$, $90_2$, $90_3$, $90_4$ and $90_5$. The resistors $90_1$ . . . $90_5$, moreover, are coupled together by means of resistors 92, 94, 96 and 98 providing respective summing nodes $100_1$, $100_2$, $100_3$, $100_4$ and $100_5$. Depending upon the binary state of each output bit of the logic circuit 18, selective switches $84_1$, $84_2$, etc. will be in a closed condition whereupon a reference current is applied from terminal 102 across the appropriate resistor $90_n$, causing a voltage drop to be developed thereacross.

An analog voltage corresponding to the summation of voltages developed by the digital output of the logic circuit 18 appears on circuit lead 48 and is fed to the comparator circuit 24 which also has applied thereto the value of the sampled analog input signal appearing on circuit lead 50. The polarity of the sampled analog signal is opposite to that of the analog signal from the D/A converter 26 such that if the output of the comparator 24 is zero, it is known that the analog input and digital output signal values are equal; if negative, it is known that the digital value is smaller than the analog value (assuming for sake of example that the analog signal is negative and the digital signal is positive); and if positive, it is known that the digital value is larger than the analog value. The output of the comparator 24 comprises an error signal which is applied to the logic circuit 18 which may comprise a parallel storage register which logically selects the next digital value to be applied to the converter apparatus 46. The procedure is repeated a certain number of cycles until the number of available digital value nearest to the analog value has been determined by the technique of successive approximation, that is the switches $84_1$ . . . $84_5$ are operated in sequence and remain open or closed depending upon the comparator output.

Thus there is a trial interval where the switches $84_1$ . . . $84_5$ are turned on one at a time by the logic circuit 18 as it is strobed. Whether a particular switch remains on or not is determined by the results of the comparison of the sampled analog input less the effect of the previous decisions, (i.e., switches which are left on), with the weighted effect (1, 1/2, 1/4, 1/8, 1/16, etc.) of the switch in question.

Heretofore, the frequency of the clock associated with a successive approximation type converter utilized a constant frequency clock which is set by the worst case settling time requirements of the converter. The present invention, however, provides the advantage that conversion speed is increased by providing means whereby the variable rate clock is controlled by the timing circuit 20 to increase its frequency as the conversion progresses since the least significant bit of the digital output will settle to an acceptable accuracy in a fraction of the worst case settling time. This is best illustrated using an approximate equation for the settling time requirements of the Mth comparison for an N bit converter:

$$t_M \cong t_C + t_L + t_{SW}(M+1)\log_e^2 + t_{LW}(M+1)\sqrt{N-M}\log_e^2$$

Where $t_C$ is the comparator propagation time, $t_L$ is the logic propagation time, $t_{SW}$ is the current switch time constant, and $t_{LW}$ is the time constant associated with each node $100_i$ of the latter network.

It can be seen, therefore, that the last term of the equation becomes smaller as $M$ approaches $N$. Typically, for a 16 bit converter ($N$= 16) a conversion time in the order of 4,000 nanoseconds is required for a conversion time with a constant frequency clock whereas a conversion time in the order of 3000 nanoseconds is required with a variable rate clock. This difference can become more or less depending upon the relative magnitudes of $t_C$, $t_L$ and $t_{LW}$ compared to $t_{SW}$. Any reduction of these time constants relative to $t_{SW}$ will allow a greater improvement with a variable rate clock.

As pointed out above, the advantage of incorporating the variable rate clock in a successive approximation analog to digital converter is reduced conversion time. Depending upon the design required for some applications the conversion time reduction could easily reach 2:1. This is significant, since the successive approximation technique has great potential accuracy but limited conversion speed.

Having described what is at present considered to be the preferred embodiment of the subject invention,

I claim:

1. In analog to digital data converter having means for applying an analog input signal, dual input analog signal comparator means having one input coupled to said input signal means, and successive approximation means including digital to analog conversion means providing an analog output coupled to the other input of said comparator means and digital circuit means coupled to the output of said analog signal comparator and being operable to generate a predetermined digital output corresponding to the difference between the analog input signal and said analog signal provided by said digital to analog conversion means, said digital output being coupled back to said digital to analog conversion means whereby the closest digital approximation of said analog input signal is generated by said digital circuit means, the improvement comprising:

an externally controlled variable frequency binary clock pulse oscillator including circuit means coupling a clock pulse output to said digital circuit means;

control circuit means comprising a strobe circuit coupled to said clock oscillator and including circuit means for receiving and counting said clock pulse output and generating binary control signals in accordance with the clock pulse count;

circuit means coupling selected predetermined binary control signals from said strobe circuit to said digital circuit means for controlling the operation thereof; and circuit means coupling at least one binary control signal from said strobe circuit back to said variable frequency clock oscillator for changing the operating frequency of said clock oscillator after a predetermined pulse count as determined by said strobe circuit whereby said operating frequency of said clock oscillator starts at a predetermined value and later increases in order to reduce overall conversion time.

2. The converter as defined in claim 1 and additionally including:

enabling means generating an enabling signal having a leading edge of a first binary logic sense; and a dual input logic gate having one input coupled to said enabling means, being responsive to said enabling signal and providing a binary output signal having a leading edge of a second binary logic sense;

time delay means coupled to said logic gate; and variable time delay means in a feedback network coupled between said first recited time delay means and the other input of said logic gate providing a delayed signal thereto having a leading edge of said opposite binary logic sense wherein said logic gate then provides a binary output of said first binary logic sense.

3. The apparatus as defined by claim 2 wherein said enabling means comprises a flip-flop circuit.

4. The apparatus as defined by claim 2 wherein said logic gate comprises a NAND logic gate and said variable time delay means includes circuit means coupled to and responsive to said at least one control signal from said timing circuit means.

5. The apparatus as defined by claim 4 wherein said variable time delay means includes at least one switch controlled resistance-capacitance time delay network the time delay of which is determined by the RC time constant of said network;

switch means operatively coupled to said time delay network and operated by another enabling signal; and a flip-flop circuit coupled to and operated by said at least one control signal from said control circuit means and being operative to produce said another enabling signal for operating said switch means.

6. The invention as defined by claim 3 wherein said variable time delay means includes at least two switch control resistance-capacitance time delay networks wherein the respective time delay is determined by the RC time constant of each network and first and second switch means operatively coupled respectively to said two time delay networks and controlled by respective flip-flop circuits responsive to control signals from said control circuit means for rendering said networks successively inoperative, thereby effecting a plurality of frequency changes of said oscillator.

7. The apparatus as defined by claim 6 and additionally including a first voltage amplifier, having a logic inversion, coupled between said networks and a second voltage amplifier, having a logic inversion coupled between the second time delay network and said other input of said logic gate.

8. The apparatus as defined by claim 7 wherein said first and second switch means comprise semiconductor switches.

9. The apparatus as defined by claim 8 wherein said semiconductor switches are comprised of FET switch devices.

10. In an analog to digital data converter having means for applying an analog input signal, dual input analog signal comparator means having one input coupled to said input signal means, and successive approximation means including digital to analog conversion means providing an analog output coupled to the other input of said comparator means and digital circuit means coupled to the output of said analog signal comparator and being operable to generate a predetermined digital output corresponding to the difference between the analog input signal and said analog signal provided by said digital to analog conversion means, said digital output being coupled back to said digital to analog conversion means whereby the closest digital approximation of said analog input signal is generated by said digital circuit means, the combination comprising:

enabling means generating an enabling signal having a leading edge of a first binary logic sense;

an externally controlled variable frequency clock oscillator including a. a dual input logic gate having one input coupled to said enabling means, being responsive to said enabling signal and providing a binary output signal having a leading edge of a second binary logic sense, b. time delay means coupled to said logic gate, c. variable time delay means in a feedback network coupled between said first recited time delay means and the other input of said logic gate providing a delayed signal thereto having a leading edge of said opposite binary logic sense wherein said logic gate then provides a binary output of said first binary logic sense, and d. circuit means coupling a clock pulse output to said digital circuit means;

control circuit means coupled to said clock oscillator and including circuit means for receiving and counting said clock pulse output and generating control signals in accordance with the clock pulse count;

circuit means coupling selected predetermined control signals from said control circuit means to said digital circuit means for controlling the operation thereof; and circuit means coupling at least one control signal from said control circuit means back to said variable frequency clock oscillator for changing the operating frequency of said clock oscillator after a predetermined pulse count whereby said operating frequency of said clock oscillator starts at a predetermined value and later increases in order to reduce overall conversion time.

* * * * *